United States Patent [19]
Vinggaard et al.

[11] Patent Number: 5,815,507
[45] Date of Patent: Sep. 29, 1998

[54] ERROR DETECTOR CIRCUIT FOR DIGITAL RECEIVER USING VARIABLE THRESHOLD BASED ON SIGNAL QUALITY

[75] Inventors: Niels Vinggaard; Arvind S. Arora, both of Arlington Heights, Ill.

[73] Assignee: Motorola, Inc., Schaumburg, Ill.

[21] Appl. No.: 632,701

[22] Filed: Apr. 15, 1996

[51] Int. Cl.$^6$ .......................... G06F 11/00; G06F 11/10
[52] U.S. Cl. ........................................ 371/5.1; 371/43.7
[58] Field of Search .......................... 371/5.1, 5.5, 20.1, 371/20.3, 30, 37.1, 37.4, 38.1, 39.1, 43, 44, 45, 67.1, 68.2, 5.2, 5.3, 5.4, 28, 43.1, 43.6, 43.7; 375/224, 227, 228; 445/67.1, 67.3, 67.7, 135, 226.1, 226.3, 226.4

[56] References Cited

U.S. PATENT DOCUMENTS

| | | | |
|---|---|---|---|
| 5,091,920 | 2/1992 | Ikeda et al. | 375/317 |
| 5,113,400 | 5/1992 | Gould et al. | 371/43.7 |
| 5,142,551 | 8/1992 | Borth et al. | 371/43.6 |
| 5,148,431 | 9/1992 | Hayashi | 371/5.1 |
| 5,321,705 | 6/1994 | Gould et al. | 371/43.7 |
| 5,323,421 | 6/1994 | LaRosa et al. | 371/5.1 |
| 5,331,642 | 7/1994 | Valley et al. | 371/5.2 |
| 5,483,690 | 1/1996 | Schröder | 455/226.1 |
| 5,497,383 | 3/1996 | Thome et al. | 371/43.7 |
| 5,557,639 | 9/1996 | Heikkila et al. | 375/224 |
| 5,630,210 | 5/1997 | Mary et al. | 455/67.3 |

FOREIGN PATENT DOCUMENTS

| | | |
|---|---|---|
| 0 548 939 A2 | 6/1993 | European Pat. Off. . |
| 0 648 032 A1 | 4/1995 | European Pat. Off. . |
| 2 262 416 | 6/1993 | United Kingdom . |
| 2 305 083 | 3/1997 | United Kingdom . |
| 92/22162 | 12/1992 | WIPO . |
| 94/17472 | 8/1994 | WIPO . |
| 95/08152 | 3/1995 | WIPO . |

*Primary Examiner*—Trinh L. Tu
*Attorney, Agent, or Firm*—Randall S. Vaas

[57] ABSTRACT

An error detector circuit (300) for a discrete receiver indicates bad frames of binary information signals which contain distorted bits of data in numbers so great as to prevent a convolutional decoder (738) from generating, accurately, a decoded signal. A variable threshold generator (440) generates a variable threshold level according to the signal quality estimate for the received signal. When bit errors are detected in numbers beyond the variable threshold or when a first preselected value of the signal quality of a received signal combined with the detected number of bit errors forms a signal beyond a second preselected value, a bad frame is indicated.

20 Claims, 5 Drawing Sheets

ERROR DETECTOR CIRCUIT FOR DIGITAL RECEIVER USING VARIABLE THRESHOLD BASED ON SIGNAL QUALITY

FIELD OF THE INVENTION

The present invention relates generally to error detector circuitry and more particularly to a bad frame indicator for detecting bad frames of information signals received by a receiver.

BACKGROUND OF THE INVENTION

Communication devices such as cellular radiotelephones, cordless radiotelephones, land-line telephones, modulators/demodulators (Modems), data terminals, pagers, two-way radios, and the like communicate over communication links such as cables, twisted wire pairs, and radio frequency (RF) air interfaces. These communication links are subject to noise and other transmission difficulties such as intersymbol interference and Raleigh fading. Consequently, a receiver in such a communication system may not receive the signal as transmitted by a transmitter.

In digital communication systems, such as digital radiotelephones, it is important to maintain the quality of received signals at such a level that subsequent audio signals are not distorted. In these systems, to insure that the audio quality as perceived by a user is satisfactory, the radiotelephone receiver should pass to a speech decoder only those speech frames received for which there is a high level of confidence that the received signal is not distorted. It is also important that speech frames that the receiver can correct are passed to the speech decoder to avoid a high degree of muting and speech extrapolation which occurs when too many frames are rejected.

In view of these requirements, a great deal of effort has been expended to develop systems that monitor the received encoded speech frames and reliably distinguish between good and bad speech frames for purposes of removing only those speech frames that are not recoverable. One particularly advantageous receiver is disclosed in U.S. Pat. No. 5,497,383, issued to Thome et al. on Mar. 5, 1996, the disclosure of which is incorporated herein by reference. This receiver generates an estimated bit-error signal from a decoded speech frame and compares the estimated bit-error signal to a preselected threshold. It also generates a measured signal strength and compares this measured signal strength to another preselected signal threshold. If either preselected threshold is exceeded, the frame is not passed.

Although this error detector provides a significant improvement over other bad frame detectors, it remains desirable to provide an even more accurate system of determining when significantly-distorted signals received by a receiver should be rejected by the receiver.

SUMMARY OF THE INVENTION

A bad frame indicator for a receiver includes a threshold generator receiving an estimated signal quality signal and generating a variable threshold level as a function of the estimated signal quality signal. According to one aspect, a first error signal is of a level proportional to the number of times in which values of signal portions of a sequence of the hard decision signal differ with values of a corresponding sequence of the re-encoded decoded signal generated by the coder.

A second detector according to one aspect of the invention can comprise a circuit to measure signal magnitude levels of at least one signal portion of a signal representative of the sequence of the discretely-encoded signal received by the receiver. The threshold generator according to another aspect of the invention can compare a measured value of a segment of a frame to a segment threshold to determine whether the segment of the frame is bad. According to yet another aspect of the invention, a plurality of segments of the frame can each be compared to the segment threshold, and the threshold generator can select a threshold based upon the number of segments of the frame that are determined to be bad.

According to another aspect of the invention, each of the segments is a burst and the measured value of each of the segments is an estimate of the noise in each burst. According to yet another aspect of the invention, the weighted error signal formed by the combiner is formed by multiplying values of the first error signal and the signal-quality signal together.

According to another aspect of the invention, the signal generator comprises a first comparator having a first input and a second input wherein the weighted error signal is applied to the first input of the first comparator and a first threshold signal of a value corresponding to the preselected threshold value is applied to the second input of the first comparator, the first comparator being operative to generate a first comparison signal responsive to times in which the weighted error signal is of a value greater than the first threshold signal. According to another aspect of the invention, a second comparator has a first input and a second input wherein the first error signal is applied to the first input of the second comparator and the variable threshold level is applied to the second input of the second comparator, the second comparator being operative to generate a second comparison signal responsive to times in which the first error signal is of a value greater than the variable threshold level.

According to another aspect of the invention, a signal quality estimate generator generates an estimate of a signal quality in a received signal from a noise signal, the estimate of the signal quality input to the threshold generator as the estimated signal quality signal.

BRIEF DESCRIPTION OF THE DRAWINGS

FIG. 2-1 is a representation illustrating one frame of a digitally-encoded communication signal;

FIG. 2-2 is a representation of the frame of the digitally-encoded communication signal of FIG. 2-1 encoded by a channel encoder according to a coding technique to introduce signal redundancies therein;

FIG. 2-3 is a representation of the frame of a digitally-encoded communication signal received by the receiver and decoded by a channel decoder according to a decoding technique corresponding to the coding technique used to encode the digitally-encoded communication signal to form the signal of FIG. 2-2;

FIG. 4-1 is a representation of a single frame of a communication signal received by a receiver, once decoded and then re-encoded during operation of the error detector circuit of FIG. 3;

FIG. 4-2 is a representation of a single frame of a signal, still in encoded form, after reception by a receiver that includes the error detection circuit of FIG. 3;

FIG. 4-3 is a representation of a single frame of a signal formed as a result of a comparison between the signals represented in FIGS. 4-1 and 4-2;

DETAILED DESCRIPTION OF THE PREFERRED EMBODIMENTS

Figure 1:
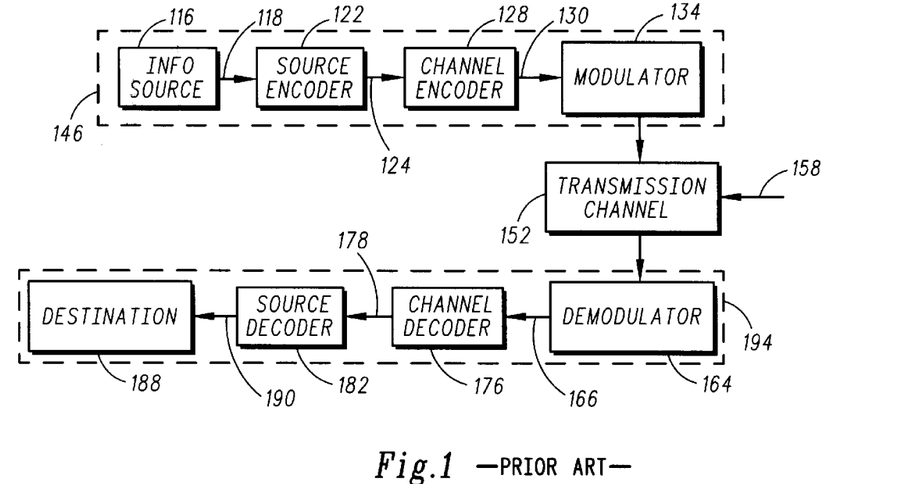
FIG. 1 is a block diagram illustrating a communication system operable to transmit and to receive discretely-encoded communication signals.

Referring first to the block diagram of FIG. 1, a communication system 100 is shown. Communication system 100 is operable to transmit and to receive discretely-encoded communication signals.

An information source, here represented by block 116, is representative of the source of a communication signal such as, for example, a voice signal. In instances in which information source 116 is comprised of a voice signal, information source 116 includes a transducer for converting the voice signal into electrical form.

The communication signal generated by information source 116 is supplied, by way of line 118, to source encoder 122. Source encoder 122 converts the communication signal supplied thereto on line 118 into a discrete signal. Source encoder 122 can, for example, be comprised of any suitable commercially available analog-to-digital converter which generates a digital signal at an output thereof.

The discrete signal generated by source encoder 122 is generated on line 124 which is coupled to channel encoder 128 to supply the discrete signal thereto. Channel encoder 128 encodes the discrete signal applied thereto according to a coding technique. Channel encoder 128 may, for example, comprise a block or convolutional encoder, or a combination thereof. Channel encoder 128 is operable to increase the redundancy of the discrete signal applied thereto on line 124. By increasing the redundancy of the discrete signal, transmission errors and distortion introduced upon the signal during transmission are less likely to prevent a receiver portion of communication system 100 from detecting an actual, transmitted signal.

The encoded signal generated by channel encoder 128 is applied on line 130 to modulator 134. Modulator 134 modulates the encoded communication signal applied thereto according to a modulation technique. Modulator 134 generates a modulated carrier signal formed of the encoded signal applied thereto and a carrier signal.

Information source 116, source encoder 122, channel encoder 128, and modulator 134 together comprise a transmitter, referred to generally by reference numeral 146 and indicated by the block shown in hatch which encompasses such elements.

The modulated carrier signal generated by modulator 134 of transmitter 146 is transmitted upon a transmission channel, here indicated by block 152. Because an actual, transmission channel is not an interference-free channel, interference due, for example to noise, intersymbol interference, Raleigh fading, and signals in adjacent channels, is introduced upon the modulated carrier signal when the modulated carrier signal is transmitted thereupon. Such interference is indicated in the figure by line 158 applied to transmission channel 152.

The modulated carrier signal transmitted by transmitter 146 upon transmission channel 152 is received by a receiver 194. The receiver 194 includes demodulator 164 which is operative to demodulate the modulated carrier signal, once received by the receiver. Demodulator 164 generates a demodulated signal on line 166 which is applied to channel decoder 176. Channel decoder 176 corresponds to channel encoder 128 of transmitter portion 146 and is operative in a manner reverse with that of channel encoder 128, thereby to decode the encoded signal applied thereto by demodulator 164. Channel decoder 176 generates a decoded signal, in discrete form, on line 178 which is coupled to source decoder 182.

Source decoder 182 converts the discrete signal applied thereto on line 178 into a form suitable for application to destination 188 by way of line 190. Destination 188 may, for example, comprise a speaker portion of a receiver or another such transducer for converting the electrical signal applied thereto into human perceptible form.

Demodulator 164, channel decoder 176, source decoder 182, and destination 188 together comprise the receiver, here referred to generally by reference numeral 194, indicated in the figure by the block shown in hatch.

Figure 21:
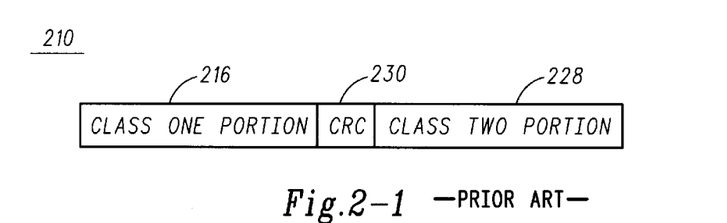

Turning now to FIG. 2-1, a single frame, referred to generally by reference numeral 210, of a digitally-encoded communication signal is represented. A frame is defined as a pre-determined number of bits, here digital bits. The digital bits, when positioned in sequential fashion, together form a coded word, alternately referred to as a code word or an encoded signal.

Frame 210 illustrated in the figure is representative of a frame defined in the Groupe Special Mobile (GSM) standard for cellular radiotelephone communications. Those skilled in the art will recognize that these bits are transmitted in bursts, and in GSM by way of example, a frame includes eight bursts (not shown) which together form a frame. It will also be recognized by those skilled in the art that the present invention is similarly applicable in other time division multiple access (TDMA), and in any of many other communication schemes in which communication signals are discretely-encoded prior to transmission thereof.

Frame 210 of FIG. 2-1 is representative of an encoded signal generated by a source encoder, such as source encoder 122 of transmitter 146 of communication system 100 of FIG. 1. Frame 210 of FIG. 2-1 forms a code word having two portions of data bits, here a class one portion 216 and a class two portion 228. Portions 216 and 228 are together 260 bits in length, with portion 216 of a bit length of 182 bits and portion 228 of a bit length of 78 bits. Parity bits, referred to by the phrase cyclic redundancy check, or CRC, forming parity bit portion 230 of a length of three bits is interspersed amongst portions 216 and 228. Again, it should be noted that other frame lengths and configuration are similarly possible, and that the portion lengths just-noted correspond to the GSM standard.

Figure 22:
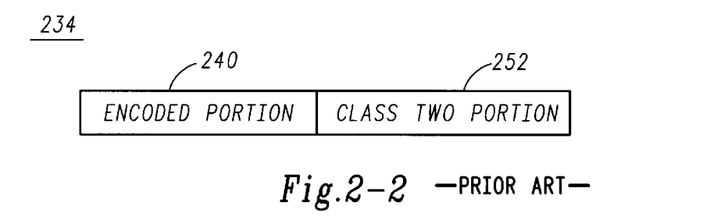

FIG. 2-2 is a representation of a single frame, here referred to generally by reference numeral 234, representative of frame 210 of FIG. 2-1 after a channel encoder has encoded a portion of frame 210. Class one portion 216 and parity bit portion 230 are together encoded to form encoded portion 240 of frame 234. Class two portion 252 of frame 234 corresponds to portion 228 of frame 210 and is not channel-encoded.

Portion 240 is of a length of 378 bits. While not of significance here, prior to encoding of portions 216 and 230 of frame 210, a desired number of bits, here four bits, may be appended thereto which serve to facilitate later decoding of encoded portion 240 formed therefrom. As portion 252 is not channel-encoded, portion 252 is of a similar bit length, namely 78 bits, as is portion 228.

Encoded portion 240 is of an increased bit length, relative to bit portion 216 together with portion 230 of frame 210, to increase thereby the redundancy of such portion, thereby to reduce the possibility that distortion of frame 234 during transmission thereof upon a transmission channel would prevent accurate recreation of the actual communication signal comprising portion 216 of frame 210. Greater, or smaller, portions of a frame may be encoded by a conventional coding technique, as desired.

Figure 23:
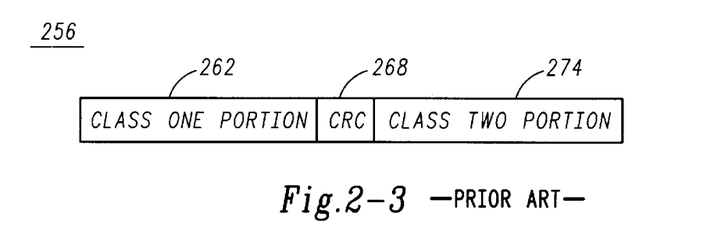

FIG. 2-3 is a representation of a frame, here referred to generally by reference numeral 256, indicative of a frame received and decoded by a decoder portion of a receiver, such as receiver portion 194 of communication system 100 of FIG. 1. Frame 256 is comprised of class one portion 262, a parity bit, or CRC, portion 268, and a class two bit portion 274. Ideally, frame 256 of FIG. 2-3 is identical to frame 210 of FIG. 2-1. However, as described hereinabove, because the transmission channel, indicated in communication system 100 of FIG. 1 by block 152, is not noise-free and interference is introduced upon a modulated carrier signal transmitted thereupon, the signal may be distorted during transmission thereof. Distortion of the signal during transmission thereof may, therefore, cause one or many bits of portions 262, 268, and 274 to differ with corresponding portions 216, 230, and 228 of frame 210.

Use of a coding technique, for example a convolutional coding technique such as a Viterbi convolutional coding technique, reduces the possibility that distortion of class one bit portion 240 occurring during transmission thereof would prevent accurate recreation of the actual, class one bit portion 216 of frame 210.

Figure 3:
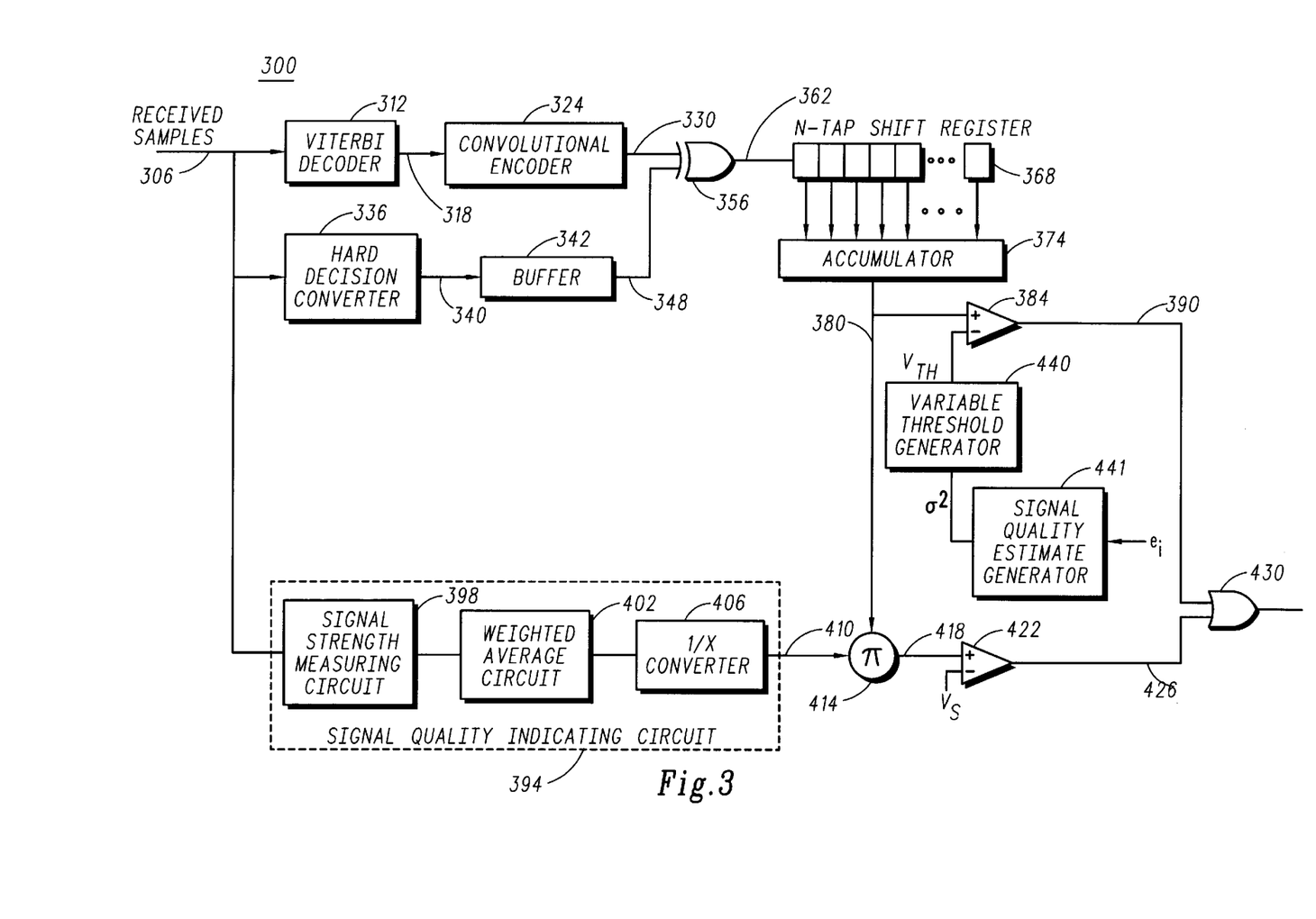
FIG. 3 is a circuit diagram in block diagram form of the error detector circuit.

FIG. 3 illustrates an error detector circuit, referred to generally by reference numeral 300, of a preferred embodiment of the present invention. Error detector circuit 300 is operative to receive at least samples representative of a signal received by a receiver. And, in the preferred embodiment, circuit 300 receives signals representative of signal values of the signal portions of each frame comprising a modulated signal transmitted to a receiver incorporating circuit 300.

A signal representative of the signal received by a receiver is supplied on line 306 to Viterbi decoder 312. The signal supplied to Viterbi decoder 312 is as a soft decision signal. Viterbi decoder 312 generates a decoded signal on line 318 which is supplied to convolutional encoder 324. Convolutional encoder 324 generates an encoded signal on line 330.

When little or no distortion is introduced upon a signal during transmission thereof to a receiver incorporating error detector circuit 300, the signal generated by convolutional encoder 324 is quite similar to, or identical to, the signal applied to Viterbi decoder 312 on line 306. However, when significant portions of the signal transmitted to the receiver incorporating error detector circuit 300 are distorted, decoder 312 is unable to recreate accurately the signal actually generated by a transmitter to be transmitted therefrom to a receiver incorporating circuit 300. Hence, significant portions of the signal generated by convolutional encoder 324 on line 330 differ with corresponding portions of the signal applied to decoder 312 on line 306.

Line 306 is also coupled to hard decision converter 336 whereat the signal applied on line 306, utilized as a soft decision signal, is converted into a series of digital pulses which are stored in buffer 342. Buffer 342 is of a capacity at least as great as the length of a transmitted frame, such as frame 234 of FIG. 2-2. Output line 348 interconnects an output of buffer 342 to an input of logical gate 356, here a logical exclusive-OR gate. The re-encoded signal generated on line 330 by convolutional encoder 324 is supplied to a second input of gate 356.

Gate 356 is operative to determine when the re-encoded signal generated by encoder 324 on line 330 differs from the signal supplied to circuit 300 on line 306. Gate 356 generates a comparison signal on line 362, and the comparison signal is supplied, in serial fashion, to shift register 368. Each bit of the comparison signal generated on line 362 and supplied to shift register 368 is supplied to accumulator 374.

Accumulator 374 is operative to determine the number of signal portions, here bits, which are of a logical one. When gate 356 generates the comparison signal of a logical one value, the signals applied thereto on lines 330 and 348 are of dissimilar values. Accumulator 374 is thereby operative to count the number of bit dissimilarities between the signals generated on lines 330 and 348. Accumulator 374 generates a signal on line 380 indicative of such count of bit dissimilarities. The shift register 368 stores the signals output by gate 356 for one frame, and thus the accumulator output represents the number of errors in a frame. However, the shift register 368 can store one burst, four bursts (half a frame), or any other size subset of the frame, and the accumulator can sum the sum the contents of the shift register for multiple subsets such that the accumulator output represents a frame. For example, if the shift register holds four bursts, the accumulator can sum the output of the shift register for two consecutive frames to produce a result representing a single frame.

A variable threshold generator 440 generates threshold VTH input to comparator 384. The variable threshold generator generates a threshold signal VTH from a received signal quality estimate signal $\sigma^2$ output by a signal quality estimate signal generator 441. The signal quality estimate signal $\sigma^2$ is indicative of the signal quality reflected by the signal regenerated by the receiver. This signal quality estimate signal takes into consideration all noise as it generally represents the difference between the received signal and the information data extracted from the received signal. The signal quality estimate thus includes the noise floor, RF noise, interference noise, modulation noise and noise introduced by components of the receiver.

In the preferred embodiment, the signal quality estimate signal $\sigma^2$ is generated by signal quality estimate generator 441 from the signal ei output by summer 562 in U.S. Pat. No. 5,142,551, issued to Borth et al. on Aug. 25, 1992, entitled SIGNAL WEIGHTING SYSTEM FOR DIGITAL RECEIVERS, the disclosure of which is incorporated herein by reference thereto. The signal ei is:

$$\text{Real}[x_n e^{-jn\pi/2} \Sigma\ e^{-j l\pi/2} s_l a_{n-l}] - s_0 a_n$$
wherein the summation $\Sigma$ is from $0 < 1 \leq L$;
$s$ and $a$ are as defined in Borth et al.; and
$x_n$ is $\Sigma s_l a_{n-l} e^{j(n-1)\pi/2}$
where the summation $\Sigma$ is from $0 \leq |1| = L$.

Signal ei is further processed in the signal quality estimate generator 441 to generate the estimated signal quality signal $\sigma^2$, where $\sigma^2 = K^* \Sigma[ei^2]/S_0$, K=1 if $\Sigma[ei^2] < S_0/5$ and K=1.5 if $\Sigma[ei^2] > S_0/5$. $S_0$ is the principle output of the finite impulse response filter in U.S. Pat. No. 5,142,551. $\Sigma[ei^2]$ is a summation of $e^2$ for i=1 to N, which summation is available scaled by $1/S_0$ at the output of block 592 in the U.S. Pat. No. 5,142,551. $S_0$ in U.S. Pat. No. 5,142,551 is the same as $S_0$ in the present application. The additional scalar K is thus multiplied with the output of block 592 of U.S. Pat. No. 5,142,551 to generate the signal quality estimate $\sigma^2$. The signal quality estimate generator 441 can be implemented in a digital signal processor, a programmable logic unit, a microprocessor, or the like.

The variable threshold generator 440 generates a threshold VTH as a function of the error estimate $\sigma^2$ for each burst. The threshold VTH is inversely related to the number of subsets of the frame that are below a threshold. The better the signal quality, the higher the threshold VTH. The following method can be used to generate the threshold VTH:

```
bad_burst_count=0
for (count=0; count ≤ 7; count++)
    if noise_estimate_buffer[count]<=bad_burst_thr
    add 1 to the bad_burst_count
speech_bfi_thr=55
if (bad_burst_count>2)
    speech_bfi_thr=45
if (bad_burst_count>4)
    speech_bfi_thr=40;
```

In this method, the bad_burst_count is set to 0 at the beginning of each frame. The signal quality estimate $\sigma^2$, which is the noise_estimate_buffer, for each burst is compared to a bad burst threshold, bad_burst_thr, which is a preselected value and may for example be 200 hex. A burst is an example of a subsegment of the frame for which measurements are taken. The number of bursts in a frame for GSM is 8. Each time a signal quality estimate for a burst is less than the bad_burst_thr, the bad burst count is incremented for the frame.

The default threshold is set at the beginning of each frame. This threshold speech_bfi_thr is VTH, and sets the number of 1s in the shift register 368 for a frame that will cause the accumulator 374 output to drive the comparator 384 output to generate an error signal. VTH is set to 55 at the beginning of each frame in the above method, which means that a bad frame is detected when the output of the accumulator 374 is greater than or equal to 55. This is the threshold if 0, 1 or 2 bursts have a value less than the bad_burst_thr, and it is the highest threshold for VTH. If 3 or 4 bursts in a frame are identified as bad bursts, such that they have a signal quality estimate below bad_burst_thr, then the threshold VTH is set to an intermediate level, TH2. If 5 or more bursts in a frame have a value below the bad_burst_thr, then the threshold VTH is set to 40, or TH3.

Figure 5:
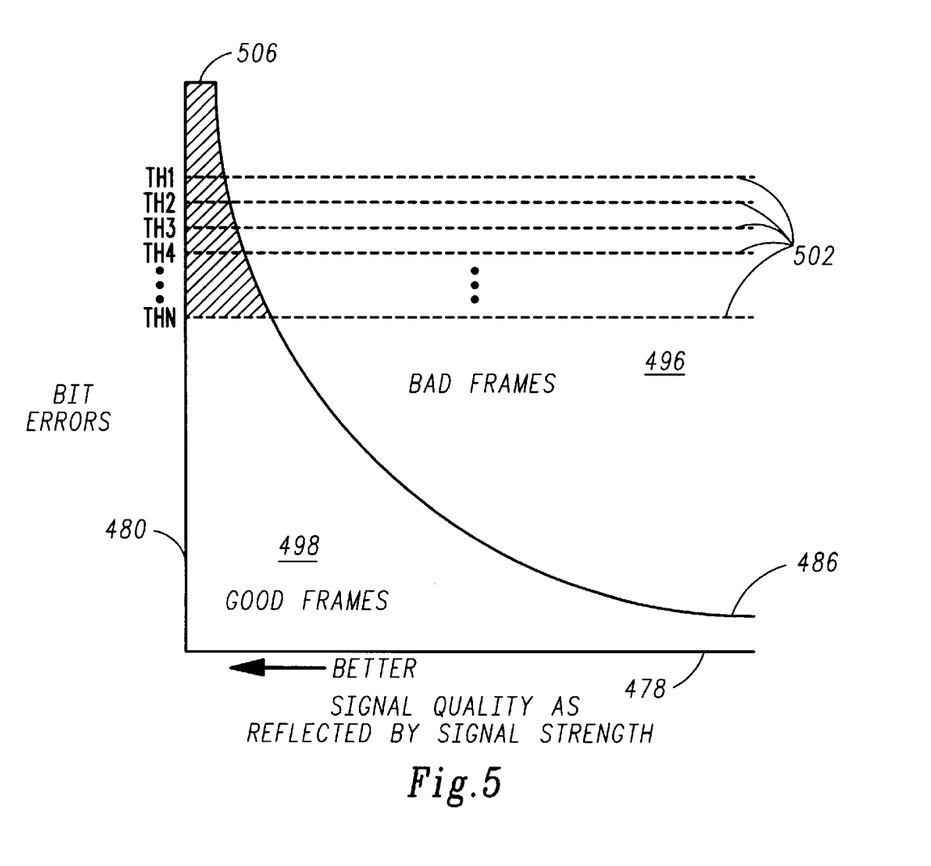
FIG. 5 is a plot of a curve formed by a combination of a signal representative of the number of bit errors in a frame of a communication signal transmitted to a receiver, and determined during operation of the error detector circuit of FIG. 3 and an inverse of a signal-quality signal, also formed during operation of the error detector circuit of FIG. 3.

It will be recognized that alternatively a different threshold VTH can be selected for each additional bad burst detected. Thus, a threshold TH1 is selected for 0 bad bursts, a threshold TH2 is selected for one bad burst in a frame, a threshold TH3 is selected for two bad bursts in a frame, a threshold TH4 is selected for three bad bursts in a frame, and a threshold THN is selected for N–1 bad frames, where N–1 is the number of bursts, or subsets, in a frame. These thresholds TH1 through THN are represented in FIG. 5, discussed hereinbelow.

Line 380 is coupled to an input of comparator 384, and the variable threshold voltage is applied to a second input of comparator 384. When the value of the signal generated by accumulator 374 on line 380 is greater than the variable threshold voltage VTH, comparator 384 generates a signal of a high value on line 390. Otherwise, comparator 384 generates a signal of a low value, or no signal, on line 390. Thus for example, if TH1 is selected to be 55 by the threshold generator, when the count at the output of the accumulator exceeds 55 the output comparator 384 is a one and for values less than or equal to 55 the output of comparator 384 is a zero.

It will be recognized that the threshold VTH is calculated while the shift register 368 is accumulating the bits for a frame. At the end of the frame, the accumulator 374 output is compared to the variable threshold VTH which is also calculated while the shift register 368 is loading the bits of the frame. Thus, VTH is available at the end of the frame when the comparison of the number of errors and the threshold for that frame is made in comparator 384. In this way a threshold is selected by variable threshold generator 440, and a comparison is made by comparator 384, on a frame-by-frame basis.

The inventors have discovered that using a fixed threshold for comparator 384 in situations where the bit error distribution looks like a random input can result in correctable frames being identified as bad frames. An example of when this might occur is where there is static frequency hopping over a limited number of frequencies by one or two strong interference signals. The use of variable threshold generator 440 significantly reduces the risk of rejecting a correctable frame in these situations.

In situations where frequency hopping and interference occurs within the time period of an individual burst, the use of a variable threshold for comparator 384 will improve confidence in marking bad frames by changing the number of bit errors allowed per frame. This occurs because the signal quality measurement includes a noise estimate even where there are high received power levels, and a bad frame decision is based in part on the noise estimate and not solely off of signal strength measurements and the number of bit errors without factoring in the noise level. In scenarios with down link discontinuous receive (DTX) and frequency hopping through the control channel (such as the control channel carrier in GSM), four bursts will have a low signal quality estimate such that there will be a higher confidence that the bad frames are marked as bad.

Line 306 is further coupled to signal quality indicating circuit 394 which, in the preferred embodiment includes a signal strength measuring circuit 398, weighted averaging circuit 402, and reciprocal inverter circuit 406, each connected in series. Circuits 398, 402, and 406 are operative, respectively, to measure the signal strength of the signal generated on line 306, to form a weighted average of such measured signal strength in a conventional manner, and to form a reciprocal of such weighted average. The signal quality indicating circuit 394 generates a signal-quality signal representative of the signal quality of the signal applied thereto as reflected by the signal strength. And, more particularly, in the preferred embodiment, the signal-quality signal is of a value corresponding to a reciprocal of a weighted average of a measured signal strength of the signal applied thereto, which is indicative of the noise floor, which is the RF noise level.

The signal-quality signal is generated on line 410 which is coupled to an input of multiplier 414. Line 380 is coupled to another input of multiplier 414 to supply the signal generated by accumulator 374 thereto. Multiplier 414 is operative to multiply the signals applied thereto on lines 380 and 410. As the signal generated by accumulator 374 on line 380 is representative of bit dissimilarities between the signals generated on lines 330 and 348 and, hence, is representative of bit "errors", the product formed by multiplier 414 forms a weighted error signal. The weighted error signal formed by multiplier 414 is generated on line 418 which is coupled to an input of comparator 422. A second threshold voltage $V_s$ is applied to a second input of comparator 422.

Comparator 422 is operative to generate an output signal on line 426 of a high logic level when the weighted error signal generated on line 418 is of a value greater than the preselected voltage level $V_s$. Otherwise, comparator 422 generates a signal on line 426 of a low logic level.

Lines 390 and 426 coupled to outputs of comparators 384 and 422, respectively, are applied to inputs of gate 430, here a logical-OR gate. Gate 430 is operative to generate an output signal, here referred to as a sequence error signal, whenever a signal of a high logical value is generated on lines 390 or 426. Such signal generated by error detector circuit 300 is utilized to provide an indication to a receiver that a received frame of a communication signal is to severely distorted (i.e., includes too many bit errors) to permit adequate recreation thereof.

It should be noted that, while circuit 300 is at least partially represented by electrical circuit components in FIG. 3, in the preferred embodiment, circuit 300 is implemented by algorithms executable by processor circuitry. Hardware implementation of circuit 300 is, of course, possible.

Figure 41:
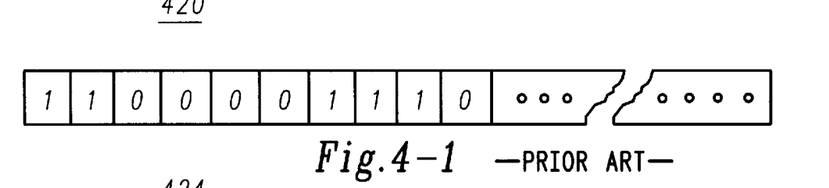

FIG. 4-1 is a representation of a single frame, here referred to generally by reference numeral 420, of a typical communication signal received and re-encoded by convolutional encoder 324 of error detector 300. For purposes of illustration, values of several of the bits of which the frame is comprised are indicated in the figure. Frame 420 corresponds to the re-encoded signal supplied on line 330 to gate 356.

Figure 42:
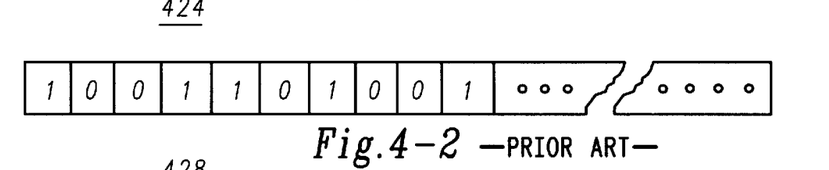

FIG. 4-2 is a representation, similar to that of the representation of FIG. 4-1, but representative of a single frame, here referred to generally by reference numeral 424, of an encoded signal received by a receiver and supplied to gate 356 of circuit 300 on line 348. Similar to frame 420 of FIG. 4-1, for purposes of illustration, values of selected ones of the bits of which frame 424 is comprised are indicated in the figure. It is to be noted that the values assigned to the bit locations are solely for purposes of illustration.

FIG. 4-3 is a representation of a single frame, here referred to generally by reference numeral 428, of the comparison signal generated on line 362 by gate 356 of error detector circuit 300 of FIG. 3. The comparison signal is of a high logical value when comparison of corresponding bits of the signals generated on lines 330 and 348, and represented by frames 420 and 424 of FIGS. 4-1 and 4-2, respectively, are of dissimilar values. Upon examination of frame 428 of FIG. 4-3, it may be discerned that when a bit of frame 420 is of the same value as that of a corresponding bit of frame 424, the corresponding bit of frame 428 is of a value of a logical zero. When the value of a bit of frame 420 is dissimilar with that of a corresponding bit of frame 424, the corresponding bit of frame 428 is of a value of a logical 1.

Figure 43:
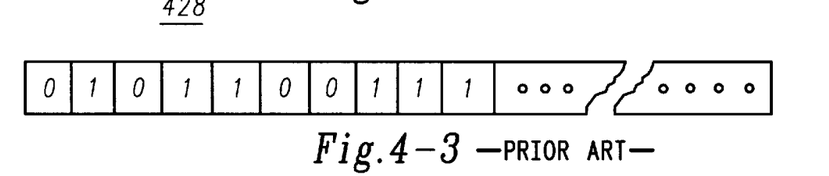

The comparison signal generated on line 362 of circuit 300, and represented by frame 428 of FIG. 4-3, is shifted into shift register 368, and accumulator 374 is operative to count the number of bits of the signal which are of a logical one value. Shift register 368 is of a length permitting the bits of an entire frame of a comparison signal to be stored therewithin, thereat to permit accumulator 374 to count the number of detected bit dissimilarities over an entire frame of data. The signal generated by accumulator 374 on line 380 is representative of the number of bit dissimilarities over the entire frame of data.

Comparator 384 of circuit 300 is operative to generate a signal on line 390 when the value of the signal generated on line 380 (i.e., the number of detected bit dissimilarities over a frame of data) is beyond a variable threshold VTH determined by variable threshold generator 440.

Comparator 422, which receives the weighted error signal on line 418 (which is the signal generated by accumulator 374 on line 380 combined with the signal-quality signal generated on line 410) is operative to generate a signal on line 426 when the weighted error signal is beyond a preselected value $V_S$. As the signal quality is, at least in part, determinative of whether a signal including distortion may be accurately decoded, the weighted error signal generated on line 418 provides an indication of the signal quality level together with the number of detected bit errors. (A signal of high signal quality having a certain number of bit errors may still be decoded accurately while a signal having the same number of bit errors but of a lower signal quality may not be accurately decoded.)

Turning next to the graphical representation of FIG. 5, the weighted error signal generated on line 418 of error detector 300 of FIG. 3 is graphically shown. The weighted error signal is formed of the product of values of the signal-quality signal, the reciprocal of which is plotted along abscissa axis 478, and a detected number of bit errors, here plotted along ordinate axis 480. Curve 486 is formed of the product of the value of the signal-quality signal and the number of detected bit errors represented by the error signal generated on line 380 of error detector 300. Values along abscissa axis 478 correspond to values of the signal-quality signal generated on line 410, the values along ordinate axis 480 correspond to the values of the error signal generated on line 380, and curve 486 corresponds to the weighted error signal generated on line 418 of error detector 300.

The area formed to the right of curve 486, here denoted by reference numeral 496, represents times in which the weighted error signal is of a greater value than the threshold voltage applied to comparator 422 to cause a signal to be generated on line 426 of error detector 300 indicative of a bad frame of data. The area to the left of curve 486, here denoted by reference numeral 498, is indicative of times in which the weighted error signal is of a value less than the threshold value applied to 422 and is indicative of a good frame of data. In most instances, such single comparison is adequate to determine whether a frame of data contains too many bit errors, given the signal quality of the received signal, to permit adequate recreation of a transmitted signal.

However, when the number of bit errors is very significant (i.e., when the error signal generated on line 380 is of a very large value) a receiver cannot accurately recreate a transmitted signal no matter how good the signal quality of the received signal is (as represented by the signal-quality signal generated on line 410). In such instances, the signal generated by comparator 384 on line 390 is utilized to provide an indication that the received frame of data includes too many bit errors to permit accurate recreation of the transmitted signal.

Lines 502 are representative of the various thresholds TH1 through THN of VTH output by the variable threshold generator 440, and each represents the number of bit errors (to compare to the value of the error signal generated by accumulator 374 on line 380) at which the comparator 384 will detect an error. Comparator 384 generates a signal having a high logic level on line 390 when the number of bit errors in a frame is above the variable threshold (i.e., the area above line 502) selected for that particular frame; otherwise comparator 384 does not generate a signal, i.e., outputs a low logic level, on line 390 (i.e., the area beneath line 502).

While substantial portions of the area above line 502 and area 496 above curve 486 overlap, a shaded portion, area 506, is above line 502 but is beneath curve 486. Hence, utilization of the signal generated by comparator 384 and 390 provides an indication of a bad frame of data in some instances in which the signal generated by comparator 422 on line 426 would indicate a good frame of data. Accordingly, by application of the signals generated on lines 390 and 426 to logical-OR gate 430, an indication is generated on line 434 to provide an indication that a frame of data contains excessive numbers of bit errors, even when the signal quality level is relatively high. By altering the values of the threshold voltages applied to comparators 422 and 384, the location of curve 486 and line 502 may be altered, as desired.

It will be recognized that although the signal quality indicating circuit 394 generates a signal indicative of the signal quality as reflected in the signal strength, there are some situations that this detector will not adequately distinguish between good and bad frames. These other situations are however more reliably considered by comparator 384 using the different threshold levels for V$_{TH}$, which thresholds are generated on a frame-by-frame basis from the signal quality as reflected by the regenerated data signal in the receiver.

Figure 6:
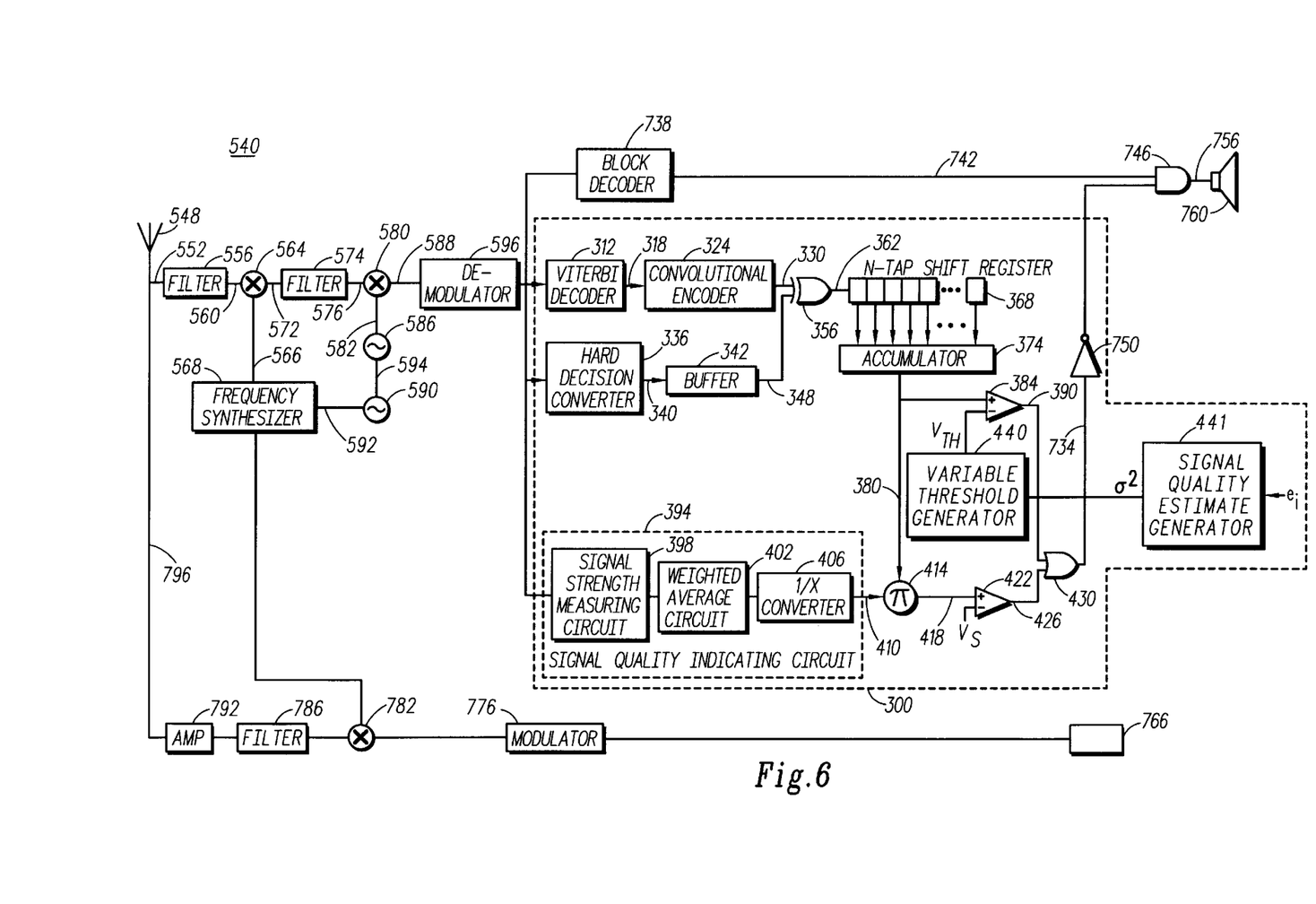
FIG. 6 is a partial block, partial circuit schematic diagram of a radiotelephone of a preferred embodiment of the present invention which includes the error detector of FIG. 3 as a portion thereof.

A radio transceiver, such as a cellular radiotelephone, here referred to generally by reference numeral 540, is illustrated in FIG. 6. Transceiver 540 incorporates the error detector circuit 300 of FIG. 3 as a portion thereof. A signal transmitted by a transmitter over a transmission channel is received by antenna 548, and an electrical signal indicative of the received signal is generated on line 552 and applied to filter 556. Filter 556 generates a filtered signal on line 560 which is applied to a first input of mixer 564. An oscillating signal generated on line 566 by frequency synthesizer 568 is applied to a second input of mixer 564. Mixer 564 is operative to generate a first down-mixed signal on line 572 which is coupled to filter 574 to apply the down-converted signal thereto.

Filter 574 generates a filtered signal on line 576 which is applied to an input of second mixer 580. An oscillating signal generated on line 582 by oscillator 586 is applied to a second input of mixer 580. Second mixer 580 is operative to generate a second down-converted signal on line 588.

Frequency synthesizer 568 and oscillator 586 are maintained in a relative frequency relationship with reference oscillator 590 by way of lines 592 and 594, respectively.

The second down-converted signal generated on line 588 by second mixer 580 is applied to demodulator 596. Demodulator 596 demodulates the signal applied thereto and generates a demodulated signal on line 606 which is applied to Viterbi decoder 312. Viterbi decoder 312 is operative to decode the signal applied thereto and to generate a decoded signal on line 318. Line 318 is coupled to convolutional encoder 324 which is operative to encode the signal applied thereto and generate an encoded signal indicative thereof on line 330.

The demodulated signal generated by demodulator 596 on line 606 is also applied to hard decision converter 336 which is operative to convert the signal thereto into a hard decision signal which is generated on line 340 and stored in buffer 342. The hard decision signal stored in buffer 342 is generated on line 348 which is coupled to an input of logical exclusive-OR gate 356. The encoded signal generated on line 330 is also applied to an input of gate 356. Gate 356 is operative to generate a comparison signal of values corresponding to comparisons between the signals generated on lines 330 and 348. The comparison signal generated on line 362 is applied to shift register 368. Accumulator 374 is operative to count the number of bits of logical one values stored in shift register 368 and to generate an error signal on line 380 indicative of such counted number of bits. Line 380 is coupled to a first input of comparator 384 and a threshold voltage is applied to a second input of the comparator. Comparator 384 generates a signal on line 390 when the error signal applied thereto on line 380 exceeds the threshold voltage level.

The signal generated by demodulator 596 on line 606 is further applied to signal quality indicating circuit 394 which is operative to determine the signal quality of the signal and to generate a signal-quality signal on line 410. Line 410 is coupled to an input of multiplier 414, and the error signal generated on line 380 is applied to another input of multiplier 414. Multiplier 414 forms the product of the signals applied thereto and generates a weighted error signal on line 418 which is applied to an input of comparator 422. A threshold voltage is applied to a second input of comparator 422. Comparator 422 generates a signal on line 426 when the weighted error signal generated on line 418 exceeds the threshold voltage level.

Lines 390 and 426 are applied to inputs of logical-OR gate 430. Gate 430 generates a received-signal sequence error signal on line 434 when a signal is generated on either line 390 or 426, or both lines 390 and 426. Error detector circuit 300 is operative to provide an indication on line 434 during times in which a frame of a signal received by transceiver 540 is so significantly distorted that the receiver portion of transceiver 540 is unable to recreate t The decotransmitted signal transmitted thereto.

The decoded signal generated by Viterbi decoder 312 on line 318 is further supplied to block decoder 438. Block decoder 438 is operative in a manner analogous to source decoder 82 of communication system 100 of FIG. 1 to decode the signal applied thereto and to generate a decoded signal on line 442 to an input of logical-AND gate 446. The received-signal, sequence error signal generated on line 734 is inverted by inverter 450 and applied to a second input of gate 446. Because of inverter 450, gate 446 generates the signal applied thereto on line 442 on output line 456 during only those times in which no received-signal, sequence error signal is generated by gate 430. Line 456 is coupled to a transducer, such as speaker 460.

Transceiver 540 further includes a transmitter portion, here shown to be comprised of a transducer 766, such as a microphone, which generates an electrical signal which is applied to modulator 776. Modulator 776 generates a signal which is applied to an input of mixer 782. Mixer 782 also receives an oscillating signal generated by frequency synthesizer 568 and generates an up-mixed signal which is applied to filter 786. Filter 786 generates a filtered signal which is amplified by amplifier 792 and which, in turn, is applied to antenna 552 by way of line 796 to permit transmission therefrom.

Figure 7:
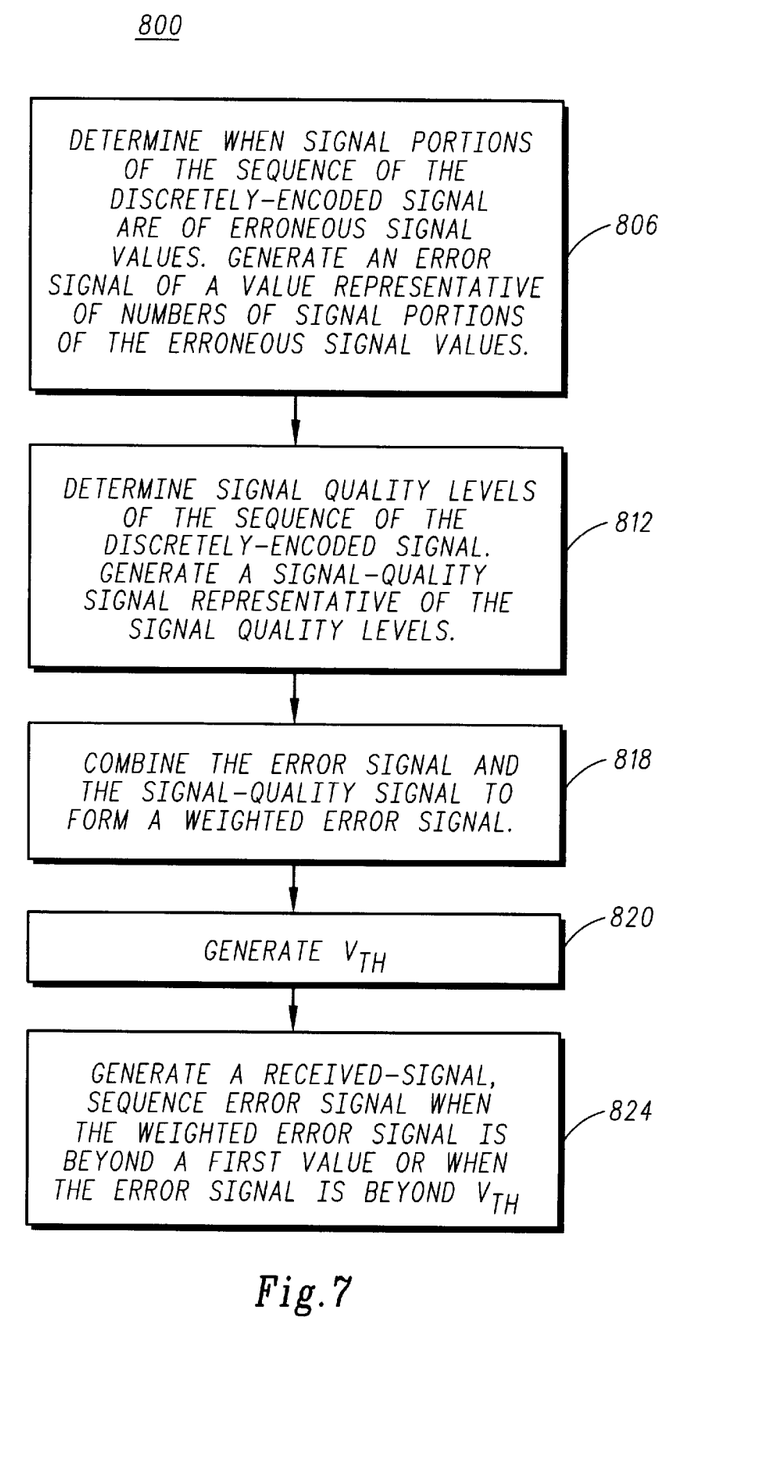
FIG. 7 is a flow diagram listing the method steps of the method of a detecting a bad frame.

Turning finally to the logical flow diagram of FIG. 7, the steps of the method are referred to generally by reference numeral 800, are listed. First, and indicated in block 806, a determination is made when signal portions of the sequence of the discretely-encoded signal received by a receiver are of erroneous signal values. An error signal indicative thereof is generated. Next, and as indicated by block 812, signal quality levels of the sequence of the discretely-encoded signal are determined. A signal-quality signal representative of such signal quality levels is also generated. Next, and as indicated by block 818, the error signal and the signal-quality signal are combined theretogether to form thereby a weighted error signal. In block 820, the variable threshold VTH is generated from the signal quality signal estimate. Finally, and as indicated by block 824, a receive-signal, sequence error signal is generated when either the weighted error signal is of a value beyond a first preselected value or the error signal is of a value beyond the variable threshold VTH.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

We claim:

1. An error detector circuit for a receiver operative to receive a discretely-encoded signal at an input thereof, the error detector circuit operative to determine when a sequence of the discretely-encoded signal is comprised of an excessive number of signal portions of erroneous signal values, the error detector circuit comprising:

a first detector coupled to the input to determine when signal portions of the sequence of the discretely-encoded signal received by the receiver are of erroneous signal values and to generate a first error signal of a value representative of numbers of signal portions determined to be of the erroneous signal values;

a second detector coupled to the input to determine signal quality levels of the sequence of the discretely-encoded signal and to generate a signal-quality signal representative of signal quality levels determined thereat;

a combiner coupled to the first and second detectors to combine the first error signal and the signal-quality signal to form thereby a weighted error signal;

a threshold generator receiving an estimated signal quality signal and generating a variable threshold level as a function of the estimated signal quality signal; and a signal generator coupled to the threshold generator, the first detector, and to the combiner, to generate a received-signal sequence error when either the weighted error signal is of a value beyond a preselected threshold value or the first error signal is of a value beyond the variable threshold level, wherein generation of a received-signal sequence error signal is indicative of when the sequence of the discretely-encoded signal is comprised of the excessive number of signal portions of the erroneous signal values.

2. The error detector circuit of claim 1 wherein said first detector comprises:

a soft decision signal generator to generate a soft decision signal representative of the discretely-encoded signal received by the receiver;

a decoder coupled to the soft decision signal generator to decode said soft decision signal representative of the discretely-encoded signal and to generate a decoded signal responsive to values of the soft decision signal;

a coder coupled to the decoder to re-encode the decoded signal generated by said decoder;

a hard decision converter coupled to the soft decision signal generator to convert the soft decision signal representative of the discretely-encoded signal received by the receiver into a hard decision signal; and a comparator coupled to the hard decision converter and the coder to compare a re-encoded decoded signal generated by the coder with the hard decision signal.

3. The error detector circuit of claim 2 wherein the first error signal is of a level proportional to a magnitude of numbers of times in which values of signal portions of a sequence of the hard decision signal differ with values of a corresponding sequence of the re-encoded decoded signal generated by the coder.

4. The error detector circuit of claim 2 wherein the decoder comprises a Viterbi decoder.

5. The error detector circuit of claim 2 wherein the coder comprises a convolutional encoder.

6. The error detector circuit of claim 2 wherein said soft decision signal is comprised of a demodulated signal demodulated by the receiver.

7. The error detector circuit of claim 2 further comprising means forming a buffer for storing a sequence of signal portions of the hard decision signal formed by the hard decision converter.

8. The error detector circuit of claim 2 wherein the comparator comprises means for performing an exclusive-or logic comparison.

9. The error detector circuit of claim 1 wherein the second detector comprises a circuit to measure signal magnitude levels of at least one signal portion of a signal representative of the sequence of the discretely-encoded signal received by the receiver.

10. The error detector circuit of claim 9, wherein said second detector further comprises means for calculating weighted-average signal magnitude levels formed of a weighted average of at least two signal portions of the signal representative of the sequence of the discretely-encoded signal received by the receiver.

11. The error detector circuit as defined in claim 1, wherein the threshold generator compares a measured value of a segment of a frame to a segment threshold to determine whether the segment of the frame is bad.

12. The error detector circuit as defined in claim 11, wherein respective measured values for plurality of segments of the frame are each compared to the segment threshold, and the threshold generator selects a threshold based upon the number of segments of the frame that are determined to be bad.

13. The error detector circuit as defined in claim 12, wherein each of the segments is a burst and the measured value of each of the segments is an estimate of the noise in each burst.

14. The error detector circuit of claim 1 wherein the weighted error signal formed by said combiner is formed by multiplying values of the first error signal and the estimated signal-quality signal together.

15. The error detector circuit of claim 1 wherein said signal generator comprises a first comparator having a first input and a second input wherein the weighted error signal is applied to the first input of the first comparator and a first threshold signal of a value corresponding to the preselected threshold value is applied to the second input of the first comparator, said first comparator being operative to generate a first comparison signal responsive to times in which the weighted error signal is of a value greater than the first threshold signal.

16. The error detector circuit of claim 15 wherein said signal generator further comprises a second comparator having a first input and a second input wherein the first error signal is applied to the first input of the second comparator and the variable threshold level is applied to the second input of the second comparator, said second comparator being operative to generate a second comparison signal responsive to times in which the first error signal is of a value greater than the variable threshold level.

17. The error detector circuit of claim 16 wherein said signal generator further comprises a logical-OR gate having a first input and a second input wherein the first comparison signal is applied to the first input of the logical-OR gate and wherein the second comparison signal is applied to the second input of the logical-OR gate, said logical-OR gate being operative to generate an output signal forming a received-signal sequence error signal when either the first comparison signal or the second comparison signal is applied thereto.

18. The error detector circuit as defined in claim 1, further including a signal quality estimate generator generating an estimate of a signal quality in a received signal from a noise signal, the estimate of the signal quality input to the threshold generator as the estimated signal quality signal.

19. A bad frame indicator for a digital receiver, comprising:

a first circuit for generating a first error signal of a value representative of a number of erroneous signal values in a frame input to the digital receiver;

a second circuit generating respective estimated signal quality signals representative of signal quality of each of a plurality of segments of the frame input to the digital receiver;

a threshold generator coupled to the second circuit to derive a variable threshold as a function of a number of the segments of the frame that are determined to be bad based upon the respective estimated signal quality signal for each segment; and a signal generator coupled to the threshold generator and the first circuit for generating a received-signal sequence error signal when the first error signal is of a value beyond the variable threshold, wherein generation of the received-signal sequence error signal is indicative of when the frame input to the digital receiver is comprised of an excessive number of signal portions of erroneous signal values.

20. In a radiotelephone transceiver having digital receiver circuitry operative to receive discretely-encoded signals, a combination with the digital receiver circuitry of an error detector circuit for determining when a sequence of the discretely-encoded signals is comprised of an excessive number of signal portions of erroneous signal values, said error detector circuit comprising:

a first generator generating a first error signal of a value representative of a number of erroneous signal values in the sequence of discretely encoded signals;

a generator generating a signal-quality signal representative of signal quality levels of signals input to the digital receiver circuitry;

a circuit to combine the first error signal and the signal-quality signal to form a weighted error signal;

a signal quality estimate generating circuit to generate an estimate of signal quality level in the signals input to the digital receiver circuitry;

an error quality circuit coupled to the signal quality estimate generating circuit to generate a variable threshold as a function of the estimate of signal quality level; and a signal generator coupled to the first generator, to the quality circuit and to the error circuit to generate a received-signal sequence error when either the weighted error signal is of a value beyond a first preselected value or the first error signal is of a value beyond the variable threshold, wherein generation of the received-signal sequence error is indicative of when the sequence of the discretely-encoded signals is comprised of the excessive number of signal portions of erroneous signal values.

* * * * *

UNITED STATES PATENT AND TRADEMARK OFFICE
CERTIFICATE OF CORRECTION

PATENT NO.  : 5,815,507
DATED       : September 29, 1998
INVENTOR(S) : Vinggaard et al.

It is certified that error appears in the above-indentified patent and that said Letters Patent is hereby corrected as shown below:

Claim 20

In column 16, line 14 of claim 20, please replace "a" with --an error--

In column 16, line 19 of claim 20, please replace "an error" with --a--

Signed and Sealed this

Nineteenth Day of January, 1999

Attest:

Attesting Officer

*Acting Commissioner of Patents and Trademarks*